United States Patent [19]
Clark et al.

[11] Patent Number: 5,539,604
[45] Date of Patent: Jul. 23, 1996

[54] TRANSIENT VOLTAGE SUPPRESSOR APPARATUS

[75] Inventors: Oscar M. Clark, Tempe; John J. Freeman, Scottsdale, both of Ariz.

[73] Assignee: Microsemi, Corp., Scottsdale, Ariz.

[21] Appl. No.: 315,829

[22] Filed: Sep. 30, 1994

[51] Int. Cl.$^6$ .................................................. H01L 29/00
[52] U.S. Cl. ................................................. 361/56; 361/118
[58] Field of Search ................................. 361/56, 58, 91, 361/115, 118, 127, 111; 257/70, 141, 360, 133

[56] References Cited

U.S. PATENT DOCUMENTS

| | | | |
|---|---|---|---|
| 4,955,132 | 9/1990 | Ozawa | 29/840 |
| 5,148,249 | 9/1992 | Koyama | 361/56 |
| 5,182,220 | 1/1993 | Ker | 361/56 |

*Primary Examiner*—Jeffrey A. Gaffin
*Assistant Examiner*—Stephen W. Jackson
*Attorney, Agent, or Firm*—Harry M. Weiss; Jeffrey D. Moy; Harry M. Weiss & Associates

[57] ABSTRACT

A protection apparatus for sensitive electronic circuitry susceptible to damage from transient voltage pulses. The apparatus includes sensitive circuitry and a transient voltage suppressor device mounted on a common circuit board or substrate. The transient voltage suppressor device comprises a semiconductor chip having a plurality of electrodes on a single major surface of the chip, the plurality of electrodes comprises over the half the area of the major surface of the chip and are mounted to surface conductors of the circuit board. The chip may contain a plurality of transient voltage suppression devices.

7 Claims, 1 Drawing Sheet

5,539,604

TRANSIENT VOLTAGE SUPPRESSOR APPARATUS

BACKGROUND OF THE INVENTION

1. Field of the Invention

The invention relates to transient voltage suppressor devices for reducing the deleterious effects of unwanted electromagnetic pulses, and more particularly to extremely low inductance transient voltage suppressor arrangements.

2. Description of the Prior Art

Many kinds of unwanted power surges occur in electronic systems. Where such systems contain sensitive electronic circuitry, components may be impaired or destroyed, rendering the electronics systems inoperative.

Various prior art devices have been used to protect against transient power surges. In particular, semiconductor PN junction devices have been connected in circuitry either as discrete devices or integrated into a semiconductor chip in order to counteract the deleterious effects of transient voltage pulses.

Such prior art surge suppression devices operate adequately for certain classes of transient pulses, particularly for those having relatively low power and slow rise times. However, certain types of transient voltage pulses, especially those arising from electrostatic discharges and electromagnetic pulses, have extremely fast rise times of the order of kilovolts per nanosecond. Such fast transient voltage pulses can frequently cause the destruction of a sensitive electronic component, such as a MOS integrated circuit, before the prior art surge suppression circuitry can react to the extremely high speed transient pulses. In the prior art surge suppressors, the electrical leads typically comprise a pair of conductors extending from opposite sides of a semiconductor chip which includes an avalanche mode transient voltage suppression device. In addition to being awkward and/or expensive to mount on a typical circuit board, such an arrangement has tended to introduce unwanted inductance into the discharge path thereby degrading the performance of the transient voltage suppression device. Thus, a need has existed to provide an improved transient voltage suppression arrangement for systems comprising sensitive electronic circuitry.

SUMMARY OF THE INVENTION

In accordance with one embodiment of this invention, it is an object of this invention to provide an improved apparatus for the transient voltage protection of sensitive electronic circuitry.

It is another object of this invention to provide an improved semiconductor transient voltage protection chip.

It is a further object of this invention to provide a transient voltage suppression apparatus wherein the inductance in the discharge path is minimized.

It is still another object of this invention to provide a transient voltage suppression apparatus wherein low inductance in the discharge path is achieved while establishing a low thermal resistance path for a transient suppression semiconductor device.

It is yet a further object of this invention to provide for low inductance, low thermal resistance mounting of a semiconductor transient voltage suppression chip in a cost-effective manner on a circuit board or other substrate containing sensitive electronic circuitry.

DESCRIPTION OF THE PRESENT INVENTION

In accordance with one embodiment of the present invention, there is disclosed a semiconductor transient voltage suppression chip having both contacts on the same major surface of the semiconductor chip. The chip is mounted directly to a surface conductor means on a circuit board in order to improve the response of the suppression device to fast rise time transient pulses.

In accordance with another embodiment of this invention, a semiconductor transient voltage suppression chip, having both contacts on the same major surface of the semiconductor chip, is configured so that the electrode means comprise a major portion of the area of said major surface in order to facilitate the transient response, as well as to improve the removal of heat from the semiconductor chip.

The foregoing, and other objects, features and advantages of the invention, will be apparent from the following more particular description of the preferred embodiments of the invention as illustrated in the accompanying figures.

DETAILED DESCRIPTION OF THE INVENTION

Figure 1:
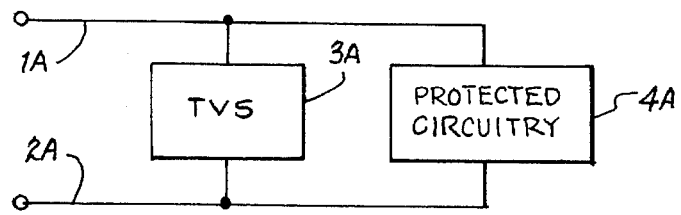
FIG. 1 is a schematic depiction of the use of a transient voltage suppressor (TVS) to prevent damage to protected circuitry.

Referring now to FIG. 1, a typical protection arrangement is depicted schematically. The protected circuitry 4A has at least a pair of terminals 1A and 2A for sending or receiving signals and which are susceptible to unwanted transient voltage pulses. Such sensitive circuitry typically operates on a few volts and may be destroyed by a very short pulse of a few tens of volts or less. A transient voltage suppressor 3A is connected across the terminals 1A and 2A. The transient voltage suppressor is comprised of a semiconductor element, such as an avalanche diode, which limits the voltage on the protected circuitry to less than a value which will cause destruction. However, if the inductance in series with transient voltage suppressor is too large, it may not conduct sufficiently rapidly to limit the voltage. And if the thermal capability of the suppressor is too low, it may fail destructively leaving the sensitive circuitry unprotected.

Figure 2:
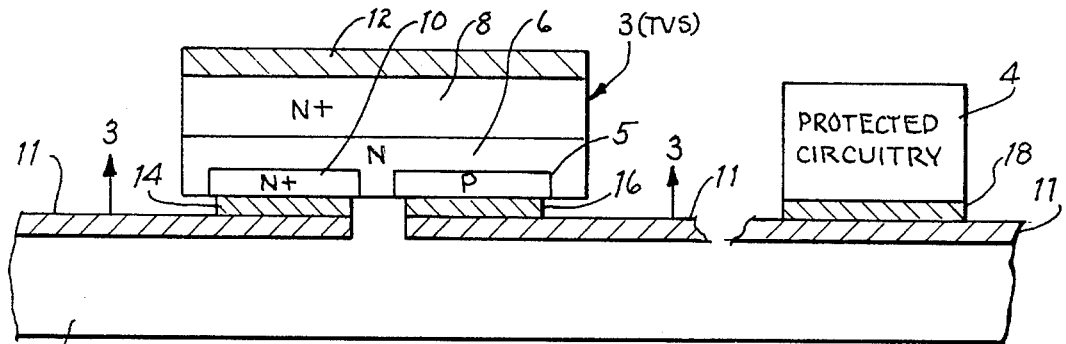
FIG. 2 is a side view in cross-section of the claimed transient voltage suppressor chip which is mounted on a circuit board along with protected circuitry.

Referring now to FIG. 2, a preferred embodiment of the present invention is shown. A portion of a circuit board 20 is comprised of at least a pair of surface conductor means 11 for mounting and interconnecting semiconductor chips and the like. For example, protected circuitry comprising transient voltage sensitive electronic circuitry 4 may be mounted through a ground plate 18 on to one of the surface conductor means 11, and may have other terminals (not shown) connected to or mounted on other surface conductor means on the circuit board 20.

In this embodiment, transient voltage suppressor 3 comprises an avalanche diode in a semiconductor chip having a first major surface facing the circuit board 20. The transient voltage suppression device 3 comprises an N-type region 6, whose doping sets the breakdown at the desired protection level. P-type region 5 forms a diode with N-type region 6, and N+-region 10 provides a heavily-doped contact region. Another heavily doped N+-region 8 ensures a low-resistance path internal to the protection chip. A pair of electrode means 14 and 16 on the suppressor 3 provide for contact to the transient voltage suppression chip and for mounting the chip onto the surface of conductor means 11 on circuit board 20. In this way the path length of the series connection to the TVS chip is minimized, reducing the inductance in the application.

As compared with a packaged device, suppressor chip 3 has reduced thermal capability for longer transient voltage pulses. To improve the thermal capability, an additional heat sink 12 may be plated on or metallurgically bonded to the second major surface of the TVS chip. In addition the surface conductor means 14 and 16 may be made thicker to improve the transient energy capability of the TVS chip.

Figure 3:
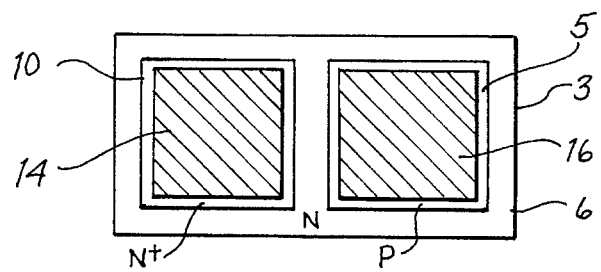
FIG. 3 is a view of the contact side of the transient voltage suppressor chip of FIG. 2 showing details of the semiconductor doping and electrode layout.

FIG. 3 is a view of the first major surface of the TVS chip 3 exemplifying the layout of the various doped regions in the device. As illustrated, the electrode means 14 and 16 comprise a major portion of the surface area of the TVS chip 3 in order to improve the thermal capability of the chip. It has been found that at least half the surface area of the TVS chip 3 should be covered by the surface conductor means 14 and 16 to achieve good performance.

Figure 4:
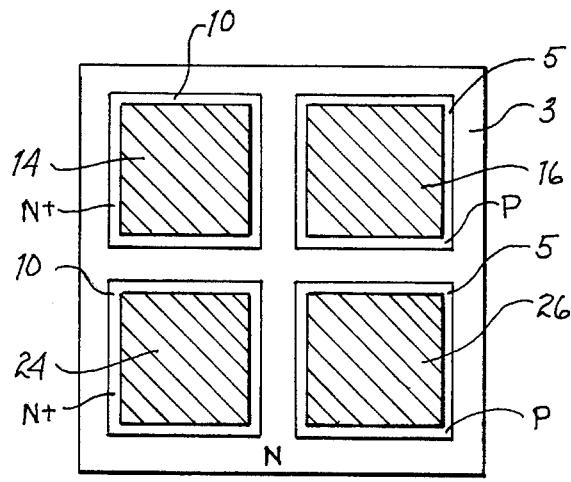
FIG. 4 is a view of the contact side of an alternative embodiment of a transient voltage suppression chip having more than one transient voltage suppression device.

Since a typical application involves the protection of a multiplicity of terminals where unwanted transient voltages may develop with respect to a common or ground terminal, a multiplicity of TVS devices may be incorporated into a common TVS chip. An example of a two-suppressor chip is given in FIG. 4. Here there are two P-type regions 5 in the chip 3, and together the surface area of the plurality of electrodes 14, 16, 24, and 26 desirably comprise at least half the surface area of the major surface of the semiconductor chip that is to be mounted to a circuit board in accordance with the arrangement shown in FIG. 2.

The particular internal design of the TVS chip may be varied. For example, the N+-region 10 in FIG. 2 may be replaced by a P-region in order to provide a suppressor with bilateral blocking capability. Alternatively, the diode could be replaced by a controlled breakover voltage thyristor. The conductivity types shown in FIGS. 2, 3 and 4 could be reversed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A protection apparatus for sensitive electronic circuitry, comprising in combination:

a circuit board, a plurality of surface conductor means on said circuit board for mounting electronic components, electronic circuitry sensitive to transient voltage pulses mounted on said surface conductor means on said circuit board, a semiconductor chip comprising a transient voltage suppression device, a first major surface on said semiconductor chip, a plurality of electrode means on said first major surface of said semiconductor chip for contacting said transient voltage suppression device, said plurality of electrode means together comprising at least half the surface area of said first major surface on said semiconductor chip and, said plurality of electrode means on said semiconductor chip being mounted on said surface conductor means on said circuit board.

2. The protection apparatus of claim 1 further including a second major surface opposite said first major surface on said semiconductor chip, and heat sink means on said second major surface of said semiconductor device for improving the ability of said device to withstand transient voltage pulses.

3. The protection apparatus of claim 1 wherein said transient voltage suppression device is an avalanche diode.

4. The protection apparatus of claim 1 wherein said transient voltage suppression device is a bilateral blocking device.

5. The protection apparatus of claim 1 wherein said transient voltage suppression device is a thyristor.

6. The protection apparatus of claim 1 wherein said semiconductor chip comprises a plurality of transient voltage suppression devices.

7. The protection apparatus of claim 1 wherein said transient voltage suppression device is electrically connected with said sensitive electronic circuitry.

* * * * *